United States Patent [19]

Covaro

[11] Patent Number: 5,945,814
[45] Date of Patent: Aug. 31, 1999

[54] METHOD AND APPARATUS FOR A LOW VOLTAGE HIGH CURRENT BI-DIRECTIONAL TERMINATION VOLTAGE REGULATOR

[75] Inventor: Mark Covaro, Sunol, Calif.

[73] Assignee: Cisco Technology, Inc., San Jose, Calif.

[21] Appl. No.: 08/965,320

[22] Filed: Nov. 6, 1997

Related U.S. Application Data

[60] Provisional application No. 60/058,611, Sep. 10, 1997, and provisional application No. 60/062,391, Oct. 7, 1997.

[51] Int. Cl.$^6$ .............................. H02J 1/02; G05F 1/613; H04B 3/00

[52] U.S. Cl. .......................... 323/224; 323/284; 323/269; 326/30; 257/529

[58] Field of Search ..................................... 323/224, 269, 323/276, 287, 280, 284, 279, 266; 326/30; 257/529; 307/243, 241, 443; 363/16

[56] References Cited

U.S. PATENT DOCUMENTS

| | | | |
|---|---|---|---|
| 3,675,114 | 7/1972 | Nercessian | 323/269 |
| 4,982,314 | 1/1991 | Miki | 363/16 |
| 5,381,034 | 1/1995 | Thrower et al. | 257/529 |
| 5,608,312 | 3/1997 | Wallace | 323/224 |

OTHER PUBLICATIONS

Network Systems Tutorial for IEEE Std 802.3, Repeater Functions and System Design Topology Considerations for Carrier Sense Multiple Access with Collision Detection (CSMA/CD) Local Area Networks (LANs); Section 4, Repeater Functions, pp. 7–14 (1995).

International Standard ISO/IEC 8802–3: 1996(E) ANSI/IEEE Std 802.3, 1996 Edition; Carrier sense multiple access with collision detection (CSMA/DC) access method and physical layer specifications; Section 9, Repeater unit for 10 Mb/s baseband networks, pp. 125–155.

*Primary Examiner*—Peter S. Wong
*Assistant Examiner*—Rajnikant B. Patel
*Attorney, Agent, or Firm*—Ritter Van Pelt and Yi, LLP

[57] ABSTRACT

A low voltage high current bi-directional termination voltage regulator for use in a bus termination circuit in a repeater stack is disclosed that includes an operational amplifier, a bipolar transistor current source circuit, and a bipolar transistor current sink circuit. The operational amplifier is configured to source current to a first node when the output voltage at a second node is pulled below a nominal termination voltage and configured to sink current from the first node when the output voltage at the second node is pulled above the nominal termination voltage, the second node being connected to a termination load. The bipolar transistor current source circuit is configured to source current to the second node when the operational amplifier sources current to the first node so that the output voltage at the second node is pulled up as a result of the current sourced by the bipolar transistor current source circuit through the second node to the termination load. The bipolar transistor current sink circuit is configured to sink current from the second node when the operational amplifier sinks current from the first node so that the output voltage at the second node is pulled down as a result of the current sinked by the bipolar transistor current source circuit through the second node from the termination load. Thus, the output voltage at the second node is maintained at the nominal termination voltage.

20 Claims, 5 Drawing Sheets

METHOD AND APPARATUS FOR A LOW VOLTAGE HIGH CURRENT BI-DIRECTIONAL TERMINATION VOLTAGE REGULATOR

CROSS REFERENCE TO RELATED APPLICATIONS

This application claims priority to U.S. Provisional Patent Application No. 60/058,611 (Attorney Docket No. 35826.0003) filed Sep. 10, 1997 and U.S. Provisional Patent Application No. 60/062,391 (Attorney Docket No. CISCP024+) filed Oct. 7, 1997.

This application is related to co-pending U.S. patent application Ser. Nos. 08/965,479; 08/965,330; 08/964,602; 08/964,601; 08/965,460; and 08/965,323 (Attorney Docket Nos. CISCP020, CISCP021, CISCP022, CISCP023, CISCP025, and CISCP026, respectively) filed concurrently herewith, which are incorporated herein by reference for all purposes.

BACKGROUND OF THE INVENTION

1. Field of the Invention

The present invention relates generally to methods and apparatuses for providing a low voltage high current bi-directional termination voltage regulator. More specifically, the invention relates to methods and apparatuses for providing a voltage regulator suitable for sourcing and sinking a maximum of approximately 1 Amp of current from data lines that make up a stack bus for the purpose of terminating the stack bus to a termination voltage of approximately 2.5V at an impedence of approximately 68Ω. In one embodiment, the bi-directional termination voltage regulator is used to source and sink current for a termination circuit that terminates a stack bus for a Class II Fast Ethernet repeater stack. The termination circuit is selectively connected to the bus at the repeaters in the repeater stack that happen to be plugged into the top and bottom ends of the stack. The termination circuit prevents reflections of signals on the bus that would otherwise occur and degrade the performance of the bus. The low voltage high current bi-directional termination voltage regulator enables the termination circuit to source and sink large amounts of current while using only a low voltage termination power supply at about 4V from the stack bus connection cable.

2. Description of the Related Art

The growth of local-area networks (LANs) has been driven by the introduction of Ethernet Technology as well as the availability of powerful, affordable personal computers and workstations. As a result, applications that once were possible only on mainframe computers are now running on LANs. Network speed and availability are critical requirements. However, existing applications and a new generation of multimedia, groupware, imaging, and database products can tax a network running at Ethernet's traditional speed of 10 megabits per second (Mbps). Moreover, with more applications requiring faster LAN speeds for acceptable performance, network managers increasingly find that high-performance computation platforms and mission-critical applications can overwhelm a 10 Mbps network. Network managers therefore are increasingly implementing high-speed LAN technology.

FAST ETHERNET

For organizations with existing Ethernet installations, increasing the network speed to 100 Mbps is preferable to investing in a completely new LAN technology. This user preference has driven the industry's decision to specify a higher-speed Ethernet that operates at 100 Mbps. This higher-speed Ethernet is known as Fast Ethernet.

In July 1993, a group of networking companies joined to form the Fast Ethernet Alliance. The charter of the group was to draft the 802.3µ 100BaseT specification ("802.3 specification") of the Institute of Electrical and Electronics Engineers (IEEE) and to accelerate market acceptance of Fast Ethernet technology. The final IEEE 802.3 specification was approved in June 1995. Among the other goals of the Fast Ethernet Alliance are: to maintain the Ethernet transmission protocol Carrier Sense Multiple Access Collision Detection (CSMA/CD); to support popular cabling schemes; and to ensure that Fast Ethernet technology will not require changes to the upper-layer protocols and software that run on LAN workstations. For example, no changes are necessary to Simple Network Management Protocol (SNMP) management software or Management Information Bases (MIBs) in order to implement Fast Ethernet.

Other high-speed technologies, such as 100VG-AnyLAN and Asynchronous Transfer Mode (ATM), achieve data rates in excess of 100 Mbps by implementing different protocols that require translation when data moves to and from 10BaseT. Protocol translation requires changing the frame, which often incurs higher latencies when passing through layer 2 (data-link layer) LAN switches.

In many cases, organizations can upgrade to 100BaseT technology without replacing existing wiring. Options for 100BaseT media are the same as those for 10BaseT. They include shielded and unshielded twisted pair (STP and UTP) and fiber. The Media Independent Interface (MII) provides a single interface that can support external transceivers for any of the 100BaseT physical sublayers.

CSMA/CD

Carrier sense-collision detection is widely used in LANs. Many vendors use this technique with Ethernet and the IEEE 802.3 specification. A carrier sense LAN considers all stations as peers; the stations contend for the use of the channel on an equal basis. Before transmitting, the stations monitor the channel to determine if the channel is active (that is, if another station is sending data on the channel). If the channel is idle, any station with data to transmit can send its traffic onto the channel. If the channel is occupied, the stations must defer to the station using the channel.

Figure 1:
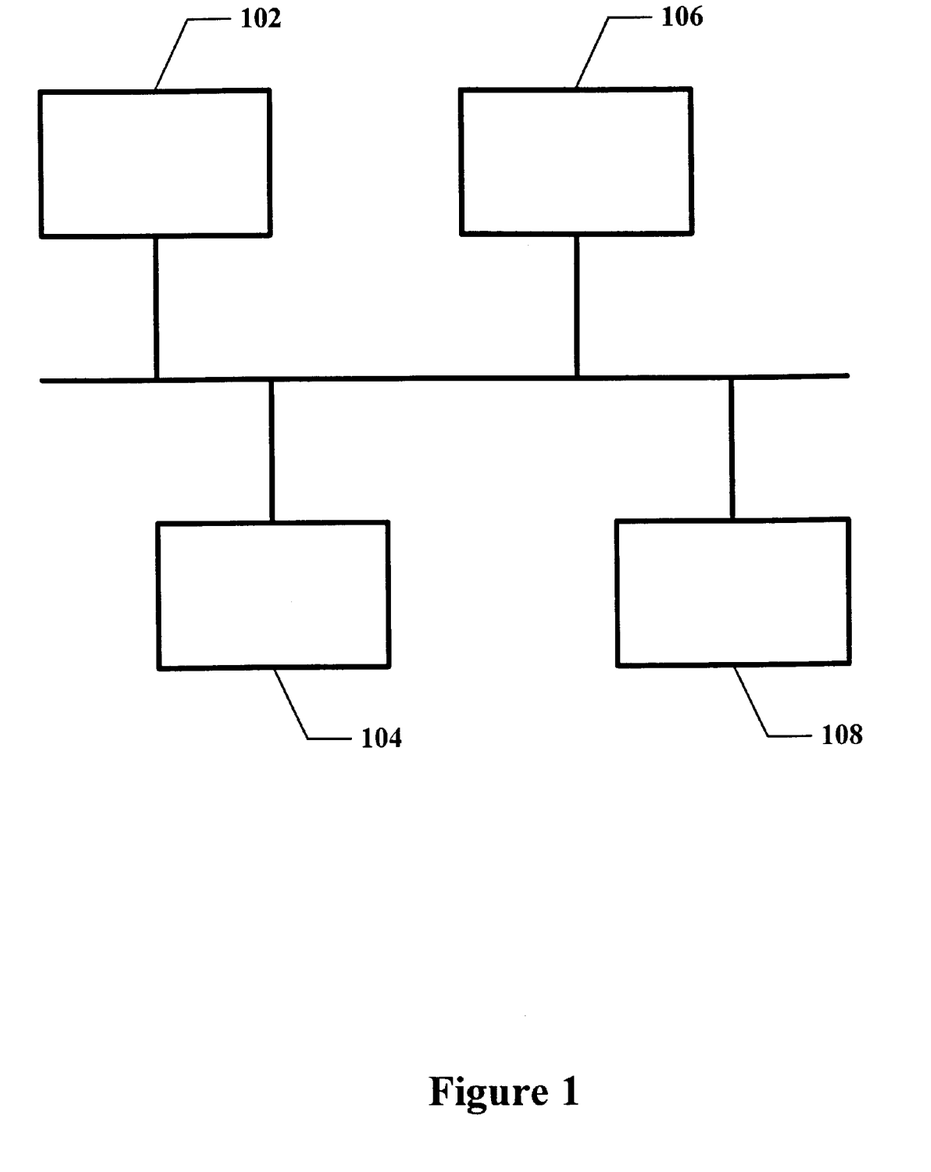
FIG. 1 is a block diagram illustrating a carrier sense-collision detection LAN.

FIG. 1 depicts a carrier sense-collision detection LAN. Network devices 102, 104, 106, and 108 are attached to a network bus 110. Only one network device at a time is allowed to broadcast over the bus, since if more than one device were to broadcast at the same time, the combination of signals on the bus would likely not be intelligible. For example, assume network devices 102 and 104 want to transmit traffic. Network device 108, however, is currently using the channel, so network devices 102 and 104 must "listen" and defer to the signal from network device 108, which is occupying the bus. When the bus goes idle, network devices 102 and 104 can then attempt to acquire the bus to broadcast their messages.

Because network device 102's transmission requires time to propagate to other network devices, these other network devices might be unaware that network device 102's signal is on the channel. In this situation, network device 102 or 104 could transmit its traffic even if network device 108 had already seized the channel after detecting that the channel was idle. This problem is called the collision window. The collision window is a factor of the propagation delay of the signal and the distance between two competing stations. Propagation delay is the delay that occurs before a network device can detect that another network device is transmitting.

Each network device is capable of transmitting and listening to the channel simultaneously. When two network device signals collide, they create voltage irregularities on the channel, which are sensed by the colliding network devices. The network devices then turn off their transmission and, through an individually randomized wait period, attempt to seize the channel again. Randomized waiting decreases the chances of another collision because it is unlikely that the competing network devices generate the same wait time.

It is important that the total propagation delay not exceed the amount of time that is required to send the smallest size data frame. This allows devices to discard data corrupted by collisions by simply discarding all partial frames. It is therefore not desirable for entire frames of data to be sent before a collision is detected. Carrier sense networks are usually implemented on short-distance LANs because the collision window lengthens as the channel gets longer. Longer channels provide opportunity for the more collisions and can reduce through-put in the network. Generally, a long propagation delay coupled with short frames and high data transfer rates give rise to a greater incidence of collisions. Longer frames can mitigate the effect of long delay, but they reduce the opportunity for competing stations to acquire the channel.

The IEEE 802.3 specification sets a standard minimum frame size of 64 bytes (512 bits). Therefore, it order for a network to comply with the standard, a station on the network must not be able to transmit 64 bytes of data before a collision is detected.

Although Fast Ethernet maintains CSMA/CD, the Ethernet transmission protocol, it reduces the transmission time for each bit by a factor of 10. Thus, the Fast Ethernet packet speed increases tenfold, from 10 Mbps to 100 Mbps. Data can move between Ethernet and Fast Ethernet without requiring protocol translation or software changes, because Fast Ethernet maintains the 10BaseT error control functions as well as the frame format and length.

REPEATERS

While some Ethernet applications connect numerous network devices to a network bus that is literally a cable connecting the network devices, it is often more desirable to connect network devices using a repeater or hub. It should be noted that in the following description the term "hub" and the term "repeater" are used interchangeably. The repeater manages collision detection for the network devices so that the network devices need only broadcast messages without detecting collisions. The repeater notifies a network device when a collision occurs during its attempt to transmit. In addition, the repeater implements a star topology so that more devices can be included on the network without violating any cable length restriction and so that many devices can be added or removed from the network efficiently.

An Ethernet repeater is a device that serves as a central station for plugging network devices included in an Ethernet network, hence the term "hub." The Ethernet repeater receives messages from the network devices that are plugged into it and broadcasts (or "repeats") the message to all of the other devices on the network along a network bus if no collision is detected. The repeater monitors network traffic in its collision domain and assumes the responsibility for collision detection. The network devices thus simply broadcast messages to the repeater and do not need to first listen before sending messages. If the repeater has already assigned the network bus to a device, then it notifies the device that tried to broadcast that a collision has occurred so that the network device may try again later. The amount of time that it takes for the repeater to receive a data signal and repeat that data signal out to every port on which the data signal is to be broadcast is referred to as the latency of the repeater.

The 802.3 specification contains maximum latency requirements that cannot be exceeded by a conforming repeater. The maximum permissible latency, combined with the requirements for maximum cable length and restrictions on the number and type of other devices allowed within a collision domain, limits the amount of time that it takes to notify a network device that a collision has occurred, ensuring that the overall 802.3 design criteria is met that all collisions are detected before a complete 64 byte frame is transmitted. If the maximum permissible latency were exceeded by a repeater, then multiple devices in the repeater's collision domain on an 802.3 ethernet network might broadcast complete frames of data before being notified of a collision. As described above, the broadcast of complete frames when a collision occurs would defeat a scheme for discarding data associated with collisions by simply discarding all partial frames.

Thus, minimizing the latency of a repeater is critical if the repeater is to be implemented on a network in accordance with the 802.3 specification. The 100BaseT standard defines two classes of repeaters: Class I and Class II. At most, a collision domain can include one Class I or two Class II repeaters. Including more than one repeater in a single collision domain is sometimes referred to as cascading repeaters. Specifically, in order to conform to the Class II requirement, the latency a repeater must be less than 46 bit times. It should be noted that the standard is expressed in terms of bit times, or the amount of data that could be transmitted on the network during the latency period.

NETWORK FLEXIBILITY

The Class II requirement, which allows more than one repeater to be included in a single collision domain, significantly adds flexibility to network topology. Expanding the number of ports available on a network may be accomplished by simply adding a second repeater in the same collision domain as a single existing repeater. No switch is required. By limiting the latency of the two repeaters, it is ensured that collisions can be detected and devices connected to different repeaters can be notified of collisions in time to stop sending data before a complete frame is broadcast.

Because networks tend to constantly change and expand with network devices being added, it would be highly advantageous if, in addition to the Class II feature of allowing two repeaters in a collision domain, it were also possible that each of the two Class II repeaters were expandable or stackable. Additional ports could be added to a first repeater stack that functions as one Class II repeater and then a second stack could be included as a second Class II repeater. Thus, stackability combined with cascadability would provide even greater flexibility for network expansion.

There is therefore a need for a stackable repeater that could be plugged into a network in a flexible manner along with a group of other repeaters in a stack. For a stack of such repeaters to conform to the latency requirements set forth in the standard, a very high speed repeater stack bus would be required. Specifically, in order to conform to the Class II requirement, the total latency of all of the repeaters in the stack connected to the repeater stack bus must be less than 46 bit times. In order for a high speed bus necessary to meet this criteria to function properly, it would be necessary to ensure proper termination of the bus by the repeaters located at the ends of the bus.

Conventionally, bus termination for a stack of repeaters or a similar group of network devices is implemented using a pair of termination plugs that are plugged into the network devices that are located on the top and bottom of the repeater stack. It should be noted that, for the purpose of this discussion, the bottom repeater is assumed to have no repeater below it connected to its input connector and the top repeater is assumed to have no repeater above it connected to its output connector. As used herein for the purpose of considering bus termination, the designation of the input and output connectors is arbitrary as is the top and bottom designation. Furthermore, the top and bottom designation refers to the position of a repeater on the repeater stack bus and not necessarily the physical position of the repeater. What is important is that the repeaters that reside on the ends of the bus provide termination to the bus. The disadvantage of using termination plugs is that the plugs may or may not be properly plugged in each time that the stack is reconfigured by a system administrator. Similarly, another approach is to provide a small switch on each repeater that may be set by a user when the repeater is located at either end of the stack. Again, this approach has the disadvantage that the user must properly configure the repeater.

What is needed is an improved apparatus and method for providing termination at the ends of a Fast Ethernet repeater stack bus. Typically, such a bus would contain a number of data lines all operating at a high frequency that alternatively source or sink current to the bus, depending on the state of each data line. The termination circuit should be able to terminate the bus at a selected termination voltage and to source or sink the maximum combined current required by all of the data lines in parallel terminated at the impedance of the bus when the bus is held at the termination voltage. Preferably, the termination circuit should work whenever at least one repeater in the stack is powered on. Thus, the termination circuit should be able to source or sink a potentially large amount of current while receiving its operating power or termination power over the stack bus at a voltage that may appropriately be provided on the stack bus cable. Termination power should be provided on the stack bus cable by any one repeater that is on and not from a separate power supply that might be turned off when the repeater that should include the termination circuit is turned off.

SUMMARY OF THE INVENTION

Accordingly, the present invention provides a low voltage high current bi-directional termination voltage regulator. In one embodiment, the bi-directional termination voltage regulator is used to source and sink a large amount of current for a termination circuit that terminates a stack bus for a Class II Fast Ethernet repeater stack. The termination circuit is connected to the bus at the repeaters in the repeater stack that happen to be plugged into the top and bottom ends of the stack. The termination circuit prevents reflections of signals on the bus that would otherwise occur and degrade the performance of the bus. The voltage regulator sources and sinks approximately 1 Amp of current from data lines which make up a stack bus for a stack bus termination circuit that terminates the stack bus to approximately 2.5V at an impedence of approximately 68Ω. The termination voltage regulator is powered by a low voltage power supply at approximately 4V that provides power over the repeater stack connection cable. Power is provided to the top and bottom repeaters regardless of whether or not they happen to be powered on.

It should be appreciated that the present invention can be implemented in numerous ways, including as a process, an apparatus, a system, a device, a method, or a computer readable medium. Several inventive embodiments of the present invention are described below.

In one embodiment, a low voltage high current bi-directional termination voltage regulator for use in a bus termination circuit in a repeater stack includes an operational amplifier, a bipolar transistor current source circuit, and a bipolar transistor current sink circuit. The operational amplifier is configured to source current to a first node when the output voltage at a second node is pulled below a nominal termination voltage and configured to sink current from the first node when the output voltage at the second node is pulled above the nominal termination voltage, the second node being connected to a termination load. The bipolar transistor current source circuit is configured to source current to the second node when the operational amplifier sources current to the first node so that the output voltage at the second node is pulled up as a result of the current sourced by the bipolar transistor current source circuit through the second node to the termination load. The bipolar transistor current sink circuit is configured to sink current from the second node when the operational amplifier sinks current from the first node so that the output voltage at the second node is pulled down as a result of the current sinked by the bipolar transistor current source circuit through the second node from the termination load. Thus, the output voltage at the second node is maintained at the nominal termination voltage.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

A repeater stack synchronous bus for providing a fast connection among a group of stacked repeaters is disclosed in U.S. patent application Ser. No. 08/965,479 (Attorney Docket No. CISCP020) which was previously incorporated by reference for all purposes. In order for such a repeater stack sychronous bus to work properly, it is necessary that the bus be terminated with a suitable impedence. In one embodiment, the repeater stack synchronous bus is terminated at each end with a 2.5 V termination circuit with an impedence matched to 68Ω±5%. In other embodiments, the impedence is matched to 68Ω±10%. The stacked repeaters are connected together with stack bus connection cables. It is particularly useful that the termination circuit is driven by an approximately 4V termination power source carried on the stack bus cable. So long as termination power is provided to the stack bus cable at 4V by one or more repeaters that are powered on, power is available to the top and bottom repeaters even one or both are powered off. In different embodiments, the voltage at which the termination power is supplied may vary. For example, the termination power voltage may vary between about 3.5 V and 6V in some embodiments. However, the termination voltage is generally not provided at a high voltage.

In one embodiment, termination power is supplied at about 4V±20%. This voltage is desirable because it is readily available from a 5V supply that is needed to supply power at a 5V potential for driving numerous logic circuits used in the repeater. The power is provided to the termination power pin by the repeater selected to provide termination power through a switch across which there is a 1V drop as is further described below. Thus, a termination voltage that may be readily provided using a 5V supply that is already present in the repeater and a desired switch is about 4V.

Figure 2:
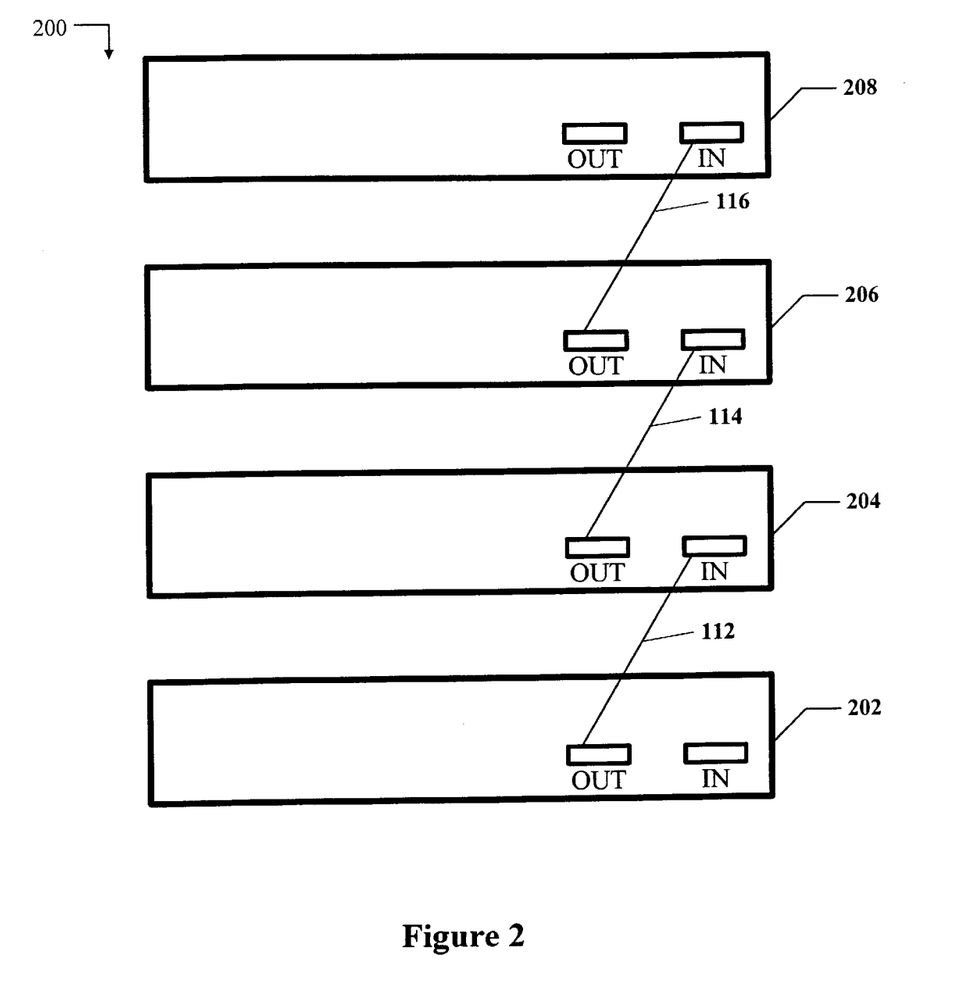
FIG. 2 is a block diagram illustrating a repeater stack.

FIG. 2 is a block diagram illustrating a repeater stack 200. Repeater stack 200 includes a bottom repeater 202, two middle repeaters 204 and 206, and a top repeater 208. Each of the repeaters in the repeater stack are connected to each other via a repeater stack bus that includes a stack bus connection cable 212 connected between repeater 202 and 204, a stack bus connection cable 214 connected between repeater 204 and 206, and a stack bus connection cable 216 connected between repeater 206 and 208. Each of the repeaters includes an input connector and an output connector. The output connector of each repeater in the stack is connected via the stack bus connection cable to the input connector of the repeater above it in the stack. It should be noted that in some embodiments the order of the repeater connectors may be changed. In fact, it is an important advantage of this arrangement that the stack can be reconfigured and the repeaters reordered by simply plugging and unplugging the repeater bus cable.

At the bottom of the repeater stack, repeater 202 has no repeater bus cable connected to its input connector. Likewise, the output connector of repeater 208 at the top of the repeater stack is not connected. As noted above, the conventional way of terminating the repeater stack bus would be to require that a bus termination plug be connected to the input connector of repeater 202 and the output connector of repeater 208. In one embodiment, the present invention eliminates the need to provide termination plugs on these connectors by including in each repeater an end unit determination circuit that senses whether or not a stack bus cable is connected to both the input connector and the output connector of the unit. If a bus termination cable is not connected to both the input connector and the output connector of a repeater unit, then that repeater unit automatically activates a bus termination circuit to properly terminate the repeater stack bus. Automatic activation of the bus termination circuit is disclosed in detail in U.S. patent application Ser. No. 08/965,330 (Attorney Docket No. CISCP021) which was previously incorporated by reference for all purposes.

Figure 3:
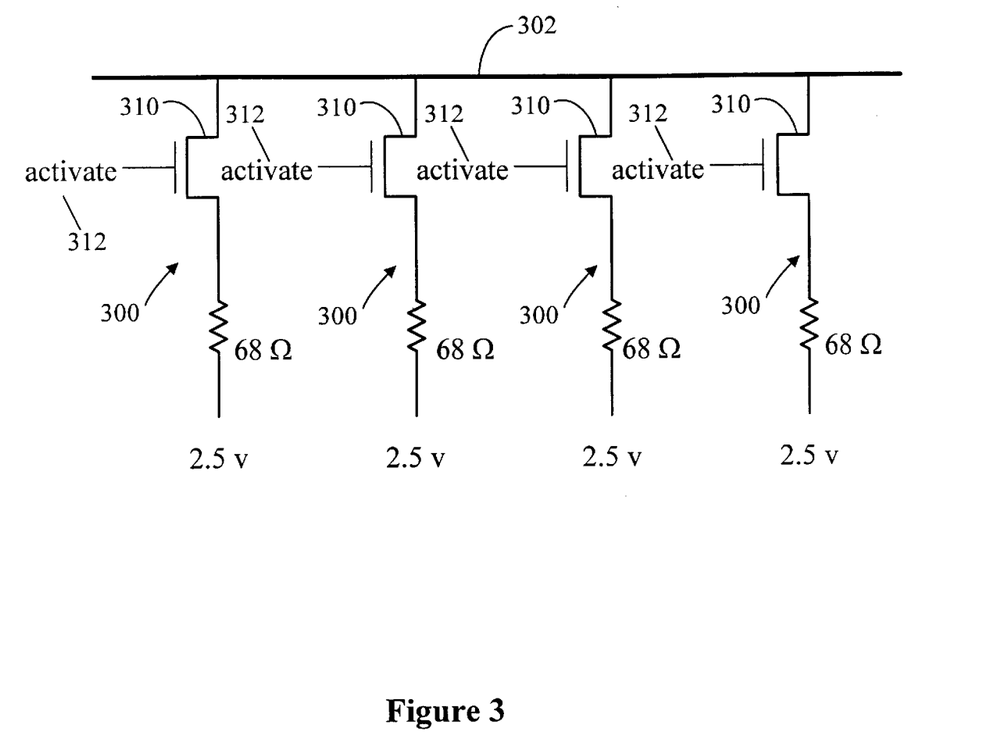
FIG. 3 is a schematic diagram illustrating a bus termination circuit implemented on each of four repeaters in a repeater stack.

FIG. 3 is a schematic diagram illustrating a bus termination circuit 300 implemented on each of four repeaters in a repeater stack in one embodiment. In each of the repeaters, bus termination circuit 300 is connected to a repeater stack bus 302. In the embodiment shown, each bus termination circuit includes a 68Ω termination resistor connected to a pull-up voltage of 2.5 volts. In other embodiments, other termination resistors or pull-up voltages including ground are used. The 2.5 pull-up voltage is preferred because it is halfway between the nominal voltages of 0V and 5V that represent the two data states of the data lines and therefore minimizes the maximum amount of current that must be sourced or sinked by the termination circuit in either direction. The 68Ω resistor and 2.5 pull-up voltage are either connected or isolated from the repeater stack bus in each repeater by an MOS switch 310. Each MOS switch is controlled by an activate signal 312. The state of the activate signal is determined by whether or not cables are plugged in to both the input and output connectors on the repeater. Thus, for each of the four repeaters, a bus termination circuit is included that is connected to or isolated from the bus depending on the state of the activate signal and the activate signal is driven high for the repeaters on the end of the stack bus so that the stack bus is properly terminated.

It should be noted that, although the stack bus is depicted as a single line in FIG. 3 for the purpose of illustration, the stack bus generally consists of a plurality of wires carrying data, each of which is terminated. In one embodiment, 21 separate data lines are terminated using termination circuit 300 at a nominal output termination voltage of approximately 2.5V at 68Ω±10%. In one embodiment, the nominal output termination voltage is held steady within less than 0.1V so long as less than one Amp of current is sourced or sinked. In one embodiment, the stack bus connection cable includes 64 wires and a standard SCSI connector is used to plug the stack bus connection cable into each repeater. Each data line is driven between approximately 5V±0.25V and 0V depending on its state by an Advanced Bi-CMOS Technology (ABT) logic driver available from National Semiconductor, Phillips, or Texas Instruments. Therefore each data line can source or sink about 37 mA of current to the termination circuit at a potential of 2.5V. 21 of such data lines could source or sink about 0.77 Amp. When factors such as the resistance of cables and voltage and impedance tolerances are considered and a safety factor added, the termination circuit must be able to source or sink about 1A of current.

It should be noted that terminating the bus at 2.5V has the advantage that about the same amount of current needs to be sourced or sinked to the data lines when the data lines transition between a 0V state and an approximately 5V state. This is preferred, although in some embodiments this symmetry in sourcing and sinking current may not exist.

As noted above, it is important that the termination circuit be activated even when one or both of the end units is powered off so that a powered off end unit terminates the bus to prevent reflections of signals back onto the bus. In order to ensure that the end unit determination circuit and the bus termination circuit for each repeater functions even when the repeater is powered off, termination power is provided to each repeater in the stack via the stack bus connection cable. One of the pins on the stack bus connection cable input connector and output connector is dedicated to providing the termination voltage and one of the repeaters in the stack is elected to provide power to the termination voltage pin.

In one embodiment, termination power is provided by the first unit in the stack that is powered on. A method for determining the first unit powered on is further described in U.S. patent application Ser. No. 08/965,460 (Attorney Docket No. CISCP025) which was previously incorporated by reference for all purposes. The first unit in the stack that is powered on provides termination power to the entire stack bus and the termination power is used to provide power to both the end unit determination circuit and the bus termination circuit in each of the repeaters. In one embodiment, the termination voltage is supplied on the bus using four wires of the 68 wire cable connected in parallel. The four wires are referred to collectively as the termination voltage wire and their pins are referred to collectively as the termination voltage pin. In one embodiment, a large 5V power supply capable of sourcing or sinking about 100 Watts is connected via a switch to the termination voltage wire. The switch is controlled by a signal that is high when the repeater is the first repeater on and that is low otherwise. The switch used is a pair of bipolar transistors in a Darlington configuration. When such a switch is used, approximately 1V is lost across the switch and so the actual voltage available from the termination voltage wire is about 4V.

The switch is controlled by a control signal that closes the switch based on whatever criteria is used to determined which repeater should provide the termination power. If the unit providing power is powered off, then a different unit is selected to provide power to the end unit determination circuits via the stack bus. In general, if any one repeater unit is turned on, then that repeater unit provides power to the repeater stack bus so that power may be provided for bus termination at the ends of the bus regardless of whether or not the repeaters on the ends of the bus are powered on.

As noted above, the selected repeater unit that provides power for bus termination is preferably the first unit that is powered on as is described in U.S. Pat. No. 08/965,460 (Attorney Docket No. CISCP025). In other embodiments, power is supplied to each of the bus termination circuits from the repeater stack bus using a separate dedicated supply or using power from one or more of the repeaters in the stack connected in parallel.

A power supply or set of power supplies that can provide the low voltage termination power to the termination power pin that is capable of sourcing and sinking large amounts of current may easily be selected. In addition, however, a termination circuit that will terminate the repeater stack bus at about 2.5V and source and sink enough current to absorb all of the signals on the data lines in the stack bus while drawing power from the termination power 4V source available on the termination power pin is required.

Figure 4:
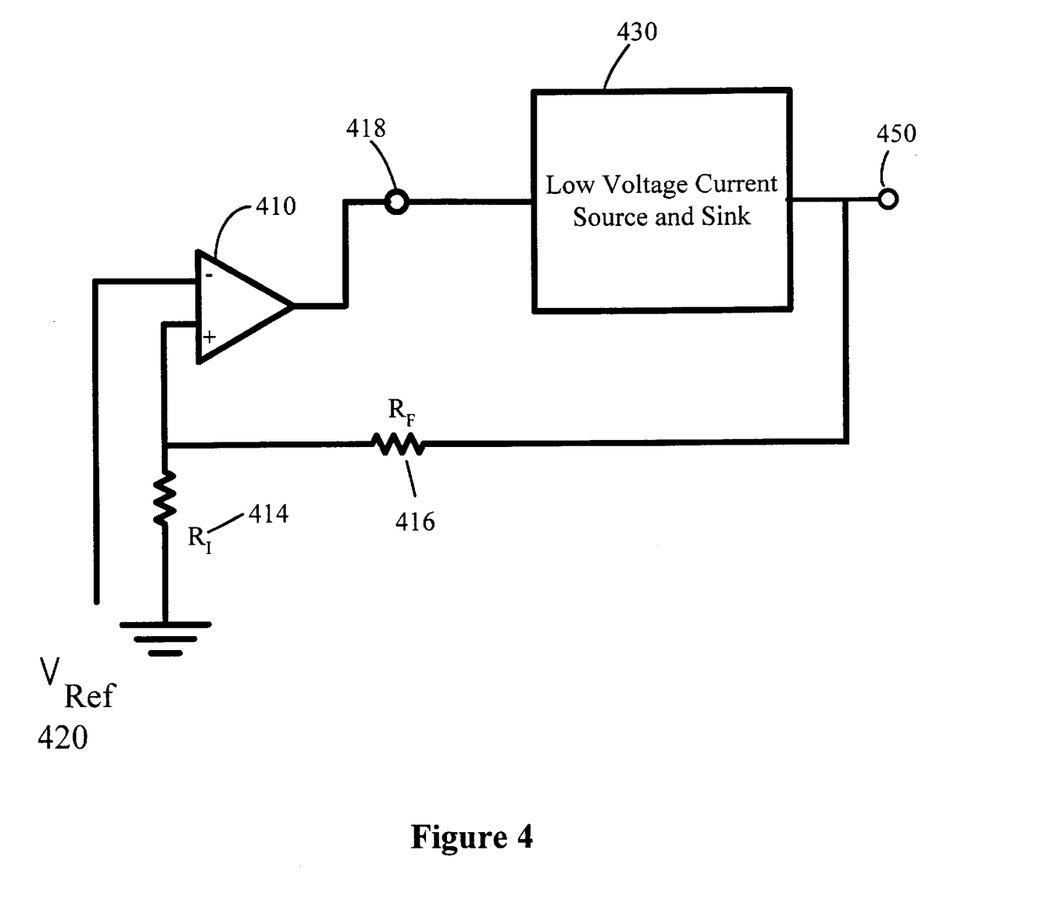
FIG. 4 is a block diagram illustrating conceptually a termination voltage regulator for sourcing and sinking up to 1 Amp of current at approximately 2.5V.

FIG. 4 is a block diagram illustrating conceptually a termination voltage regulator 400 for sourcing and sinking up to 1 Amp of current at approximately 2.5V. Termination voltage regulator 400 includes an op amp combined with a special low voltage high current source and sink circuit. Voltage regulator 400 uses a 4V power supply available from the stack bus and is also capable of sourcing and sinking enough current to effectively terminate the stack bus.

An operational amplifier (op amp) 410 is configured using a resistor 414 and a feedback resistor 416 so that its output voltage at a node 418 is twice the voltage provided by a voltage reference source 420. In one embodiment, op amp 410 is an LM324 which is an inexpensive bipolar device. An LM4041 is used to provide a reference voltage of 1.225 V. While the op amp output voltage of 2.450 at node 418 is appropriate for providing effective termination of the stack bus at about 2.5 V, op amp 410 is not capable of sourcing and sinking enough current to keep the voltage on node 418 steady at 2.45 V when the maximum possible current load is placed on the bus. If the termination voltage is not held steady, then unacceptable noise may potentially be added to the bus. One solution to this problem might be to use a more expensive CMOS op amp; however, no available op amp could be specified that could both source and sink 1 amp while maintaining a voltage output smooth enough to provide the desired bus termination. Furthermore, it would be desirable to design a circuit using the less expensive bipolar LM324 op amp. Therefore, a low voltage current source and sink discrete circuit 430 is provided in combination with the LM324 op amp for the purpose of sourcing and sinking enough current to reliably terminate the bus.

Figure 5:
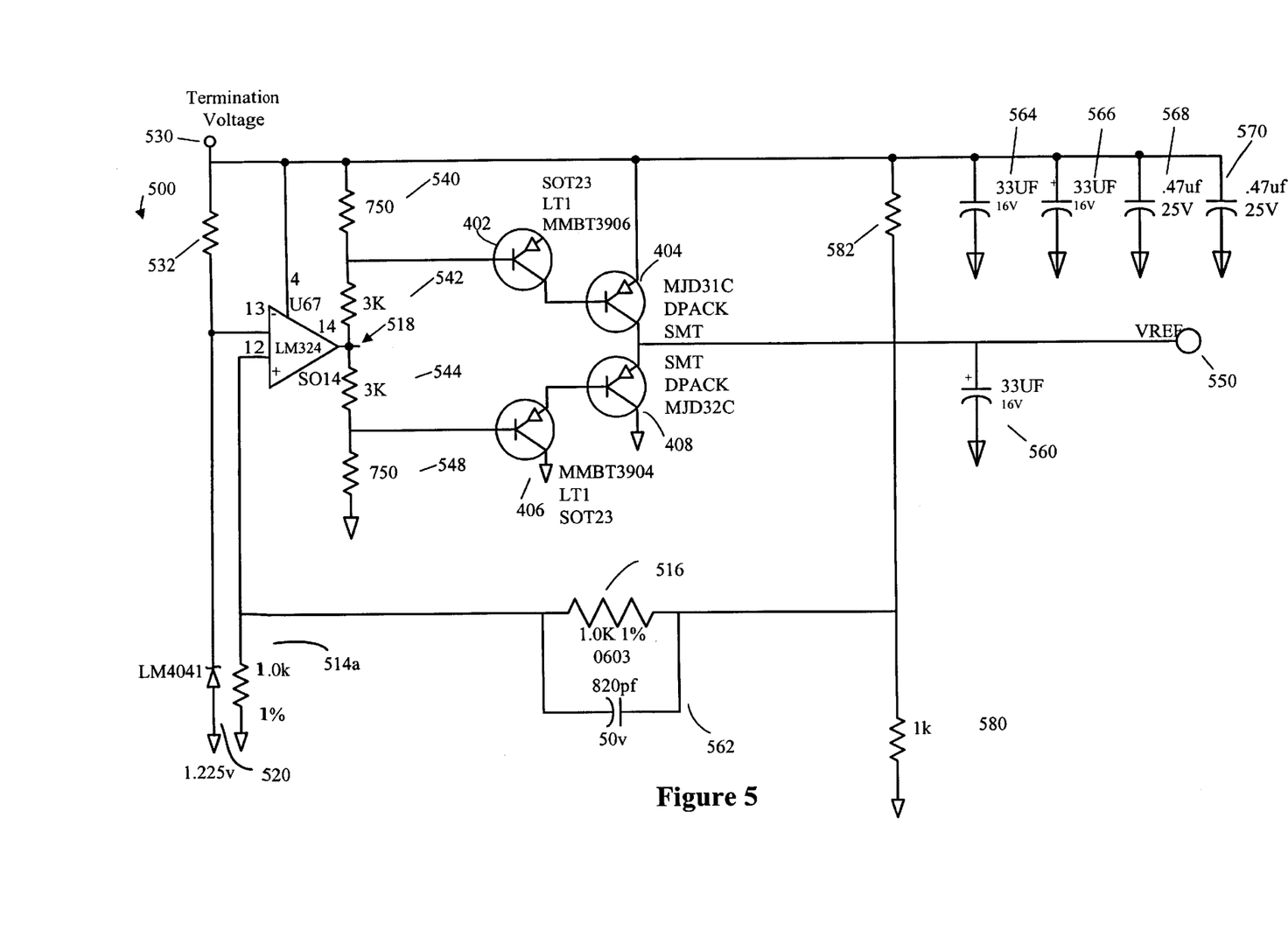
FIG. 5 is a block diagram illustrating in detail a voltage regulator circuit such as the one described more generally in FIG. 4.

FIG. 5 is a block diagram illustrating in detail a voltage regulator circuit 500 such as the one described more generally in FIG. 4. An op amp 510 is configured using a 1 kΩ resistor 514 and a 1 kΩ feedback resistor 516 so that its output voltage at a node 518 is twice the voltage provided by a voltage reference source 520. As in FIG. 4, op amp 510 is preferably an LM324 and an LM4041 is used to provide a 1.225V reference voltage so that a nominal voltage of 2.450 V is on node 518. Power for the circuit is provided by the termination power at a node 530. The termination power supply sources current to voltage reference 520 through a 1 kΩ resistor 532. It should be noted that preferably, the termination voltage is provided on multiple pins, for example, 4 pins, in order to reduce the resistive load.

A pair of bipolar transistors 402 and 404 are configured to source current to a reference node 550 whenever node 550 is pulled below 2.450 V by the termination load from the data lines. Also, a pair of bipolar transistors 406 and 408 are configured to sink current from a reference node 550 whenever node 550 is pulled above 2.450 V by the data lines. Node 550 is the voltage reference point for the bus termination. Accordingly, as described above, in one embodiment, node 550 is connected to 21 68Ω impedances, one for each terminated data line, in parallel. Node 550 may be either pulled low or pulled high by the data lines, depending on the state of the data lines.

A network of resistors including a 750Ω resistor 540, a 3 kΩ resistor 542 a 3 kΩ resistor 544, and a 750Ω resistor 546 are provided to bias a pair of current source transistors 402 and 404 and a pair of current sink transistors 406 and 408. The operation of bipolar transistors 540 and 542 as a current source may be understood as follows. When the terminated data lines pull node 550 low, the voltage on node 550 is fed back to the noninverting input of op amp 510 through feedback resistor 516. This tends to lower the voltage at the output of op amp 510 at node 518, pulling current from the base of transistor 402. The base current on transistor 402 is amplified at the collector of transistor 402 according to the Beta of transistor 402, which is in one embodiment about 100. The collector of transistor 402 is connected to the base of transistor 404. Transistor 404 is preferably a power transistor with a lower Beta than transistor 402. In one embodiment, transistor 402 has a Beta of approximately 20. The base current of transistor 404 is amplified at the emitter, which is connected to node 550. Transistors 402 and 404 thus source current to node 550 when node 550 is pulled low. The current flows through the termination impedence, causing node 550 to be pulled back up. Transistors 402 and 404 have a high current gain, preferably about 200, so that only a relatively small amount of current flows through op amp 510. Capacitors 560, 562, 564, 566, 568, and 570 of the sizes indicated are preferably used to stabilize the circuit and filter out high frequency transients. A pair of 1 kΩ resistors 580 and 582 also help bias transistors 402, 404, 406, and 408 and also help node 550 to reach its desired potential when the system is powered on.

The operation of bipolar transistors 544 and 546 as a current sink may be understood as follows. When the terminated data lines pull node 550 high, the voltage on node 550 is fed back to the noninverting input of op amp 510 through feedback resistor 516. This tends to raise the voltage at the output of op amp 5 10 at node 518. This sources current to the base of transistor 406. The base current on transistor 406 is amplified at the collector of transistor 406 according to the Beta of transistor 406, which is in one embodiment about 100. The collector of transistor 406 is connected to the base of transistor 408. Transistor 408 is a power transistor with a lower Beta than transistor 406. In one embodiment, transistor 408 has a Beta of approximately 20. The base current of transistor 408 is amplified at the emitter, which is connected to node 550. Transistors 402 and 404 thus sink current from node 550 when node 550 is pulled low. As a result, less current flows through the termination impedence and node 550 is pulled back up. Transistors 406 and 408 have a high current gain, preferably about 200, so that only a small amount of current flows through op amp 510. Again, capacitors 560, 562, 564, 566, 568, and 570 are used to stabilize the circuit and filter out high frequency transients.

The operation of transistors 402 and 404 as a the current source and transistors 406 and 408 as a current sink is roughly symmetric. Transistors 402 and 404 and transistors 406 and 408 source and sink current from the termination load so that op amp 510 need not source and sink the large current. Thus, a bi-directional low voltage high current termination voltage regulator has been disclosed for terminating the data bus in a stacked 100BaseT Fast Ethernet system.

Although the foregoing invention has been described in some detail for purposes of clarity of understanding, it will be apparent that certain changes and modifications may be practiced within the scope of the appended claims. It should be noted that there are may alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A low voltage high current bi-directional termination voltage regulator for use in a bus termination circuit in a repeater stack comprising:

an operational amplifier configured to source current to a first node when the output voltage at a second node is pulled below a nominal termination voltage and configured to sink current from the first node when the output voltage at the second node is pulled above the nominal termination voltage, the second node being connected to a termination load;

a bipolar transistor current source circuit configured to source current to the second node when the operational amplifier sources current to the first node so that the output voltage at the second node is pulled up as a result of the current sourced by the bipolar transistor current source circuit through the second node to the termination load; and a bipolar transistor current sink circuit configured to sink current from the second node when the operational amplifier sinks current from the first node so that the output voltage at the second node is pulled down as a result of the current sinked by the bipolar transistor current source circuit through the second node from the termination load;

whereby the output voltage at the second node is maintained at the nominal termination voltage.

2. A low voltage high current bi-directional termination voltage regulator as recited in claim 1 wherein the nominal termination voltage is about 2.5V.

3. A low voltage high current bi-directional termination voltage regulator as recited in claim 1 wherein the nominal termination voltage is 2.45 V.

4. A low voltage high current bi-directional termination voltage regulator as recited in claim 1 wherein the operational amplifier is a bipolar operational amplifier and wherein power is provided to operational amplifier at an input voltage of less than 5 V.

5. A low voltage high current bi-directional termination voltage regulator as recited in claim 1 wherein the operational amplifier is a bipolar operational amplifier and wherein power is provided to operational amplifier at an input voltage of about 4 V.

6. A low voltage high current bi-directional termination voltage regulator as recited in claim 1 wherein the bipolar transistor current source circuit and the bipolar transistor current sink circuit operate with an input voltage of less than 5 V.

7. A low voltage high current bi-directional termination voltage regulator as recited in claim 1 wherein the bipolar transistor current source circuit and the bipolar transistor current sink circuit operate with an input voltage of 4 V.

8. A low voltage high current bi-directional termination voltage regulator as recited in claim 1 wherein the bipolar transistor current source circuit amplifies the current sourced to the first node by a factor of about 200.

9. A low voltage high current bi-directional termination voltage regulator as recited in claim 1 wherein the bipolar transistor current source circuit includes a first transistor with a Beta of about 100 and a second transistor with a Beta of about 20, the second transistor being a power transistor.

10. A low voltage high current bi-directional termination voltage regulator as recited in claim 1 wherein the bipolar transistor current source circuit includes a first transistor and a second transistor configured so that the first transistor base is connected to the first node and the first transistor collector is connected to the second transistor base and wherein the emitter of the second transistor is connected to the second node so that current is sourced to the second node from the emitter of the second transistor.

11. A low voltage high current bi-directional termination voltage regulator as recited in claim 1 wherein the nominal termination voltage is maintained within a range of about 0.1V.

12. A low voltage high current bi-directional termination voltage regulator as recited in claim 1 wherein the second node is connected to a data bus that includes a plurality of data lines, each of the data lines connected to a load of approximately 68Ω.

13. A low voltage high current bi-directional termination voltage regulator as recited in claim 12 wherein the second node is pulled high or low according to the state of the plurality of data lines.

14. A low voltage high current bi-directional termination voltage regulator as recited in claim 12 wherein each of the data lines has a first data voltage level and a second data voltage level and wherein the nominal termination voltage is selected to be approximately midway between the first data voltage level and the second data voltage level.

15. A low voltage high current bi-directional termination voltage regulator as recited in claim 1 wherein the maximum current that the operational amplifier can source is less than about 0.5 Ampere.

16. A low voltage high current bi-directional termination voltage regulator as recited in claim 1 wherein the maximum current that the operational amplifier can source is less than about 0.1 Ampere.

17. A low voltage high current bi-directional termination voltage regulator as recited in claim 1 wherein power is provided to the operational amplifier via a termination power pin at a voltage of about 5V through a switch with a voltage drop of about 1V.

18. A low voltage high current bi-directional termination voltage regulator as recited in claim 1 wherein the operational amplifier is an LM324 op amp.

19. A low voltage high current bi-directional termination voltage regulator as recited in claim 1 further including a high frequency pass filter connecting the second node to ground.

20. A method of terminating a repeater stack bus using a low voltage high current bi-directional termination voltage regulator comprising:

sourcing current from an operational amplifier to a first node when the output voltage at a second node is pulled below a nominal termination voltage;

sinking current from the first node to an operational amplifier when the output voltage at the second node is pulled above the nominal termination voltage, amplifying the current sourced from the operational amplifier using a bipolar transistor current source circuit configured to source current to the second node when the operational amplifier sources current to the first node so that the output voltage at the second node is pulled up as a result of the current sourced by the bipolar transistor current source circuit through the second node to the termination load; and amplifying the current sinked from the operational amplifier using a bipolar transistor current sink circuit configured to sink current to the second node when the operational amplifier sinks current to the first node so that the output voltage at the second node is pulled down as a result of the current sinked by the bipolar transistor current sink circuit through the second node to the termination load;

whereby the output voltage at the second node is maintained at the nominal termination voltage.

* * * * *